(12) United States Patent
Chao

(10) Patent No.: US 11,330,690 B2
(45) Date of Patent: May 10, 2022

(54) SWITCHING DEVICE WITH AUXILIARY POWER UNIT AND WIRELESS RECEIVER FUNCTION, AND LAMP SYSTEM USING THE SAME

(71) Applicants: Chin-Wei Chao, Taipei (TW); DONGGUAN TAGUAN ELECTRONICS CO., LTD., DongGuan (CN)

(72) Inventor: Chin-Wei Chao, Taipei (TW)

(73) Assignees: Chin-Wei Chao, Taipei (TW); ECOMOTE ELECTRONICS CO., LTD., Dongguan (CN)

( * ) Notice: Subject to any disclaimer, the term of this patent is extended or adjusted under 35 U.S.C. 154(b) by 0 days.

(21) Appl. No.: 16/332,220

(22) PCT Filed: Aug. 30, 2017

(86) PCT No.: PCT/CN2017/099622
§ 371 (c)(1),
(2) Date: Mar. 11, 2019

(87) PCT Pub. No.: WO2018/049981
PCT Pub. Date: Mar. 22, 2018

(65) Prior Publication Data
US 2019/0274199 A1 Sep. 5, 2019

(30) Foreign Application Priority Data

Sep. 13, 2016 (CN) .......................... 201610819255.X
Aug. 18, 2017 (CN) .......................... 201710715911.6

(51) Int. Cl.
*H05B 47/10* (2020.01)
*F24F 11/56* (2018.01)
(Continued)

(52) U.S. Cl.
CPC .............. *H05B 47/10* (2020.01); *F24F 11/56* (2018.01); *G08C 17/02* (2013.01); *H03K 17/94* (2013.01);
(Continued)

(58) Field of Classification Search
CPC ........ H05B 45/00; H05B 45/10; H05B 45/30; H05B 45/34; H05B 47/175; H05B 47/185;
(Continued)

(56) References Cited

U.S. PATENT DOCUMENTS 5,491,591 A * 2/1996 Lemelson ............... G06F 3/153
386/314
5,621,283 A 4/1997 Watson et al.
(Continued)

FOREIGN PATENT DOCUMENTS

CN 101616523 A 12/2009
CN 102625529 A 8/2012
(Continued)

OTHER PUBLICATIONS

International Search Report dated Nov. 11, 2017.

*Primary Examiner* — Abdullah A Riyami
*Assistant Examiner* — Syed M Kaiser
(74) *Attorney, Agent, or Firm* — Bacon & Thomas, PLLC

(57) ABSTRACT

Provided are a switching device with an auxiliary power unit and a wireless receiver function, and a lamp system using the same, wherein the switching device is connectable to a lamp and includes a power switching portion, which transmits external electricity to the lamp when in a power supplying mode and stops doing so when in a power-off mode; and the auxiliary power unit in the switching device keeps powering other components of the switching device, so while the power switching portion is in the power-off (Continued)

mode, a wireless module in the switching device can still transmit a wireless signal from a wireless controller to a control unit to adjust the power switching portion to the power supplying mode. Thus, even when the switching device is in a power-off state, a user can control the lamp by sending a wireless control signal to the switching device through the wireless controller.

12 Claims, 4 Drawing Sheets

(51) Int. Cl.
G08C 17/02 (2006.01)
H05B 47/19 (2020.01)
H05B 47/185 (2020.01)
H03K 17/94 (2006.01)
H05B 45/00 (2022.01)
H05B 47/17 (2020.01)

(52) U.S. Cl.
CPC .......... *H05B 45/00* (2020.01); *H05B 47/185* (2020.01); *H05B 47/19* (2020.01); *H05B 47/17* (2020.01); *Y02B 20/40* (2013.01)

(58) Field of Classification Search
CPC ........ H05B 47/19; H05B 47/21; H05B 47/10; F24F 11/56; G08C 17/02; H03K 17/94
See application file for complete search history.

(56) References Cited

U.S. PATENT DOCUMENTS

| | | | |
|---|---|---|---|
| 6,163,275 A | 12/2000 | Hartzell | |
| 6,219,302 B1* | 4/2001 | Tanoguchi | G04R 20/10 368/187 |
| 7,988,323 B2* | 8/2011 | Johnson, III | F21S 6/004 362/228 |
| 9,081,269 B2* | 7/2015 | Conti | F21V 23/0442 |
| 9,472,955 B2* | 10/2016 | Jones | H05B 45/14 |
| 9,504,099 B2* | 11/2016 | McGuire | H05B 45/20 |
| 2008/0058960 A1 | 3/2008 | Busby | |
| 2008/0058995 A1* | 3/2008 | Holindrake | A01G 25/16 700/284 |
| 2008/0315777 A1* | 12/2008 | Ruxton | H05B 47/155 315/193 |
| 2009/0189548 A1* | 7/2009 | Hoffman | H05B 45/10 315/307 |
| 2009/0267540 A1* | 10/2009 | Chemel | H05B 47/18 315/297 |
| 2010/0295474 A1* | 11/2010 | Chemel | H05B 47/19 315/294 |
| 2010/0295475 A1* | 11/2010 | Chemel | H05B 47/175 315/294 |
| 2010/0296285 A1* | 11/2010 | Chemel | F21V 14/02 362/235 |
| 2011/0282509 A1* | 11/2011 | Yegin | G06F 1/266 700/295 |
| 2012/0019165 A1* | 1/2012 | Igaki | H05B 47/115 315/294 |
| 2012/0026726 A1* | 2/2012 | Recker | H05B 47/19 362/157 |
| 2012/0043889 A1* | 2/2012 | Recker | H05B 47/19 315/86 |
| 2012/0080944 A1* | 4/2012 | Recker | H05B 47/11 307/25 |
| 2012/0095601 A1* | 4/2012 | Abraham | H05B 47/11 700/278 |
| 2012/0215470 A1* | 8/2012 | Maguire | G01R 15/18 702/62 |
| 2012/0286676 A1* | 11/2012 | Saveri, III | H02J 50/80 315/159 |
| 2013/0114188 A1* | 5/2013 | Fitzgibbon | H04W 8/005 361/679.01 |
| 2013/0147376 A1* | 6/2013 | Trainor | H02J 9/065 315/200 R |
| 2014/0001977 A1* | 1/2014 | Zacharchuk | H04B 7/04 315/291 |
| 2014/0086590 A1* | 3/2014 | Gan | G06Q 30/02 398/118 |
| 2014/0117859 A1* | 5/2014 | Swatsky | H01H 3/02 315/158 |
| 2014/0340190 A1* | 11/2014 | Setomoto | H05B 47/155 340/3.1 |
| 2015/0091451 A1* | 4/2015 | Williams | H01R 33/9453 315/160 |
| 2015/0120000 A1 | 4/2015 | Coffey et al. | |
| 2015/0189726 A1* | 7/2015 | Spira | H05B 45/10 315/302 |
| 2015/0294603 A1* | 10/2015 | Braunstein | G09F 27/005 315/86 |
| 2015/0362668 A1* | 12/2015 | McDonald | G02B 6/0018 362/555 |
| 2015/0362896 A1* | 12/2015 | Feldstein | E06B 9/32 700/275 |
| 2016/0132065 A1* | 5/2016 | Sultenfuss | G06F 1/3265 700/295 |
| 2016/0353555 A1* | 12/2016 | Chen | H05B 45/3725 |
| 2017/0038787 A1* | 2/2017 | Baker | H05B 47/19 |
| 2018/0061603 A1* | 3/2018 | Hendrixson, III | H02J 3/00 |

FOREIGN PATENT DOCUMENTS

| | | |
|---|---|---|
| CN | 102843841 A | 12/2012 |
| CN | 103167691 A | 6/2013 |
| CN | 203675376 U | 6/2014 |
| CN | 104270863 A | 1/2015 |
| CN | 104582194 A | 4/2015 |
| CN | 105072777 A | 11/2015 |
| CN | 105142263 A | 12/2015 |
| JP | 2007242566 A | 9/2007 |
| JP | 2011070858 A | 4/2011 |
| TW | M502197 U | 6/2015 |
| TW | M511059 U | 10/2015 |
| TW | M524992 U | 7/2016 |

* cited by examiner

SWITCHING DEVICE WITH AUXILIARY POWER UNIT AND WIRELESS RECEIVER FUNCTION, AND LAMP SYSTEM USING THE SAME

FIELD OF THE INVENTION

The present invention relates to the switching device of a lamp system. More particularly, the invention relates to a switching device in which several components have an independent power source so that, even when the switching device is in a power-off state, e.g., to thereby turn off an associated lamp, a user can turn on the lamp through a wireless controller by way of the switching device.

BACKGROUND OF THE INVENTION

Recently, more and more electronic devices are designed to be wirelessly controllable thanks to technological advancements and the rapid development of wireless transmission technologies. Such designs, without doubt, reduce the difficulties of interior wiring considerably and are therefore popular among the general public.

Generally, a conventional wireless lamp system includes a lamp (e.g., an LED (light-emitting diode) lamp), a lamp driving device, a lamp switching device, and a wireless controller. The lamp driving device is electrically connected to the lamp in order to bring the lamp into an on state or an off state. The lamp switching device is typically fixed on a wall, as is a traditional mechanical lamp switch, and is electrically connected to the lamp driving device in order to allow or block the transmission of electricity to the lamp driving device and the lamp. A user, therefore, can adjust the lamp to the on or off state by operating the lamp switching device. The wireless controller can be used to send a wireless control signal to the lamp switching device, generally by an infrared transmission method, so that a user can turn on or off the lamp through the wireless controller as well.

After using the foregoing wireless lamp system in person, however, the inventor of the present invention found that there is still room for improvement, as explained below. A conventional lamp switching device switches on or off a lamp typically by "allowing or cutting off the supply of electricity"; that is to say, power supply from an external power source is allowed in order to turn on the lamp and is cut off to turn off the lamp. However, when a user turns off the lamp through the lamp switching device, the external power source is cut off from not only the lamp, but also the lamp switching device itself. As a result, the wireless module in the lamp switching device is out of power and hence inoperative; in other words, the user is now unable to turn on the lamp through the wireless controller. To restore wireless control, the user has to walk to and switch on the lamp switching device, for only when the lamp switching device receives electricity from the external power source again can the user control the lamp via the wireless controller. The operation described above is nevertheless highly inconvenient.

Besides, the inventor of the present invention found that the on and off states of some conventional electronic devices (e.g., electronic curtains) are also determined by whether power supply is allowed or cut off. The switching device of such an electronic device, therefore, is typically configured in the same way as the conventional lamp switching device described above such that, while the switching device is in a power-off state, the associated wireless controller, if any, is temporarily inactivated. Given that most electronic devices do not come with a wireless controller, one who wishes to control an electronic device is generally required to walk to that electronic device in order to turn it on or off, which causes inconvenience in use.

According to the above, the existing wireless controllable lamp systems are generally disadvantaged by the fact that their wireless controller will be rendered inoperative (i.e., the intended advantage of "wireless control" will be temporarily lost) once the lamp switching device enters the power-off state. The issue to be addressed by the present invention is to design a novel switching device that can provide better user experience by overcoming the aforesaid drawbacks. It is also desirable that this novel switching device can work with, and thus impart the function of "wireless remote control" to, an electronic device that is not wirelessly or remotely controllable in the first place.

BRIEF SUMMARY OF THE INVENTION

In view of the fact that a conventional switching device configured to work with a lamp and a wireless controller tends to cause inconvenience in use by failure to transmit the wireless control signal of the wireless controller when in the power-off state, the inventor of the present invention incorporated years of practical experience into a detailed research, extensive survey, and repeated tests and finally succeeded in developing a switching device with an auxiliary power unit and a wireless receiver function, and a lamp system using the same, the goal being to provide the general public with a switching device that is more convenient to use than its prior art counterparts.

One objective of the present invention is to provide a switching device that has an auxiliary power unit and a wireless receiver function. The switching device has an output end configured for electrical connection with an electricity transmission element. Moreover, the switching device includes a power switching portion, a control unit, a wireless module, the aforesaid auxiliary power unit, and an input unit. The power switching portion is configured to receive external electricity, can supply the external electricity to the output end when in a power supplying mode, and stops supplying the external electricity to the output end when in a power-off mode. The control unit is separately electrically connected to the power switching portion, the wireless module, and the input unit acid can adjust the power switching portion to the power supplying mode or the power-off mode according to an input signal from the input unit. The wireless module is configured to receive a wireless control l from a wireless controller and transmit the wireless control signal to the control unit, in order for the control unit to adjust the power switching portion to the power supplying mode or the power-off mode according to the content of the wireless control signal. The auxiliary power unit is electrically connected to the control unit, the wireless module, and the input unit and is configured to receive the external electricity and keep supplying to the control unit, the wireless module, and the input unit the electricity required for their operation. Thus, whether the power switching portion is in the power supplying mode or the power-off mode, the control unit, the wireless module, and the input unit will stay operative, allowing a user to adjust the mode of the power switching portion through the wireless controller by way of the wireless module and the control unit.

Another objective of the present invention is to provide a lamp system that has an auxiliary power unit and a wireless receiver function. The lamp system includes an LED lamp, a lamp driving device, a switching device, and a wireless controller. The lamp driving device is electrically connected to the LED lamp in order to adjust the light-emitting state of the LED lamp. The switching device has an output end configured for electrical connection with the lamp driving device, is configured for wireless connection to the wireless controller, and has the same structure as the s witching device described in the previous paragraph. The lamp system provides great convenience of use because the LED lamp can be turned on using the wireless controller even after the LED lamp is turned off via the switching device.

BRIEF DESCRIPTION OF THE SEVERAL VIEWS OF THE DRAWINGS

The objectives, technical features, and effects of the present invention can be better understood by referring to the following detailed description of some illustrative embodiments in conjunction with the accompanying drawings, in which.

DETAILED DESCRIPTION OF THE INVENTION

Figure 1:
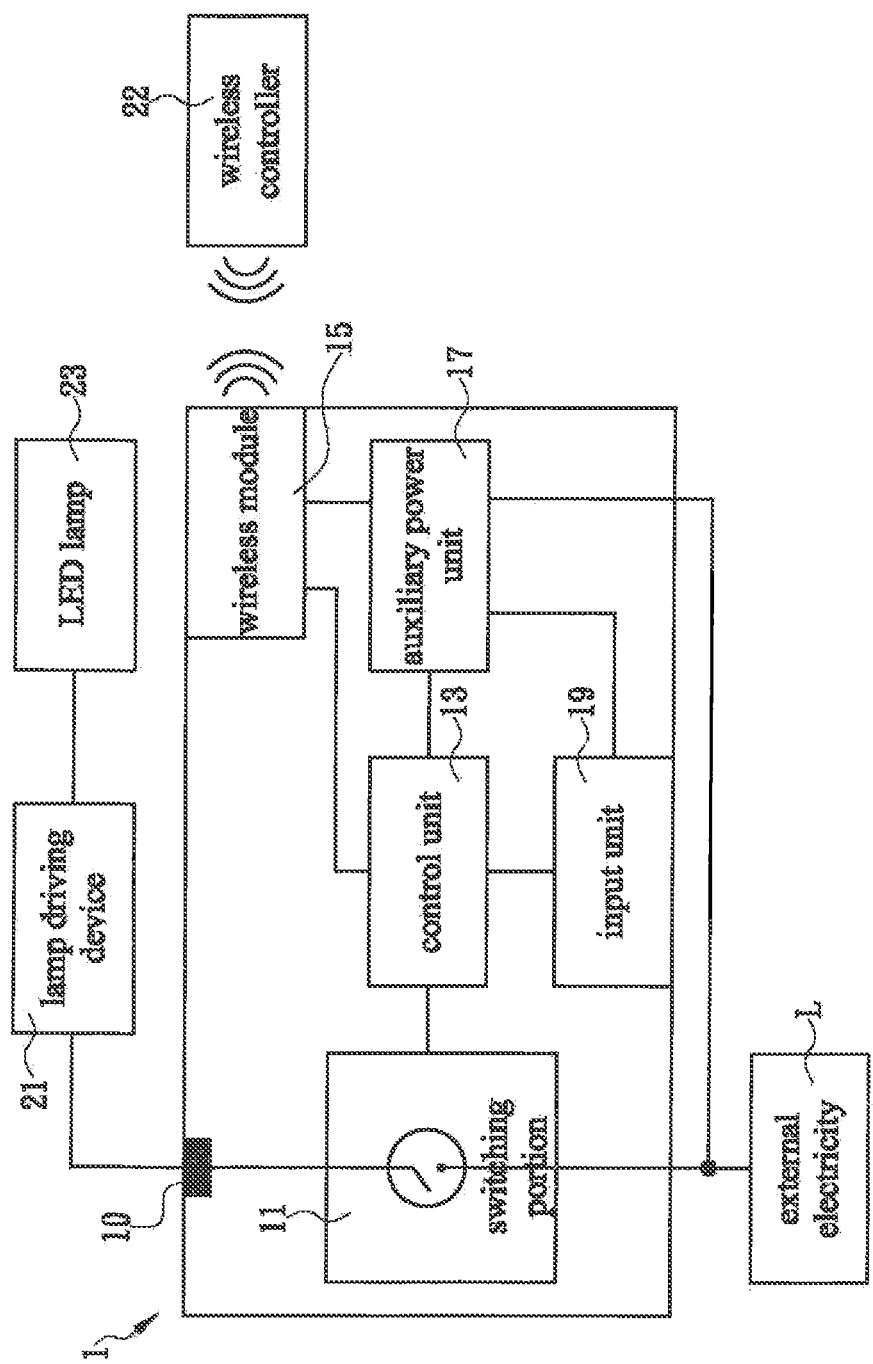
FIG. 1 is a block diagram showing the hardware of an embodiment of the present invention.

The present invention provides a switching device having an auxiliary power unit and a wireless receiver function, and a lamp system using the same. Referring to the embodiment shown in FIG. 1 and FIG. 2, the switching device 1 is configured for use in a lamp system and to be fixed on a wall. The switching device 1 is provided with an output end 10, which is electrically connectable to a lamp driving device 21 through an electricity transmission element (e.g., a wire). The switching device 1 can also connect wirelessly to a wireless controller 22 (e.g., a remote control, a smartphone, or a tablet computer). The lamp driving device 21 is electrically connected to a light-emitting diode (LED) lamp 23. A user may operate (e.g., turn on or off) the switching device 1 in order for the lamp driving device 21 to adjust the light-emitting state of the LED lamp 23. Or, a user may operate the wireless controller 22 so that the lamp driving device 21 is instructed through the switching device 1 to adjust the light-emitting state of the LED lamp 23. In this embodiment, connection between the switching device 1 and the wireless controller 22 is achieved using the "315/433 MHz/2.4 GHz wireless radio frequency (RF)" technology. In other embodiments of the present invention, however, a person skilled in the art may use WiFi, Zigbee, Bluetooth, or other wireless technologies instead to meet product requirements. Also, the present invention may be applied to a fluorescent lamp, an incandescent lightbulb, or other electronic devices in place the LED lamp 23.

Figure 2:
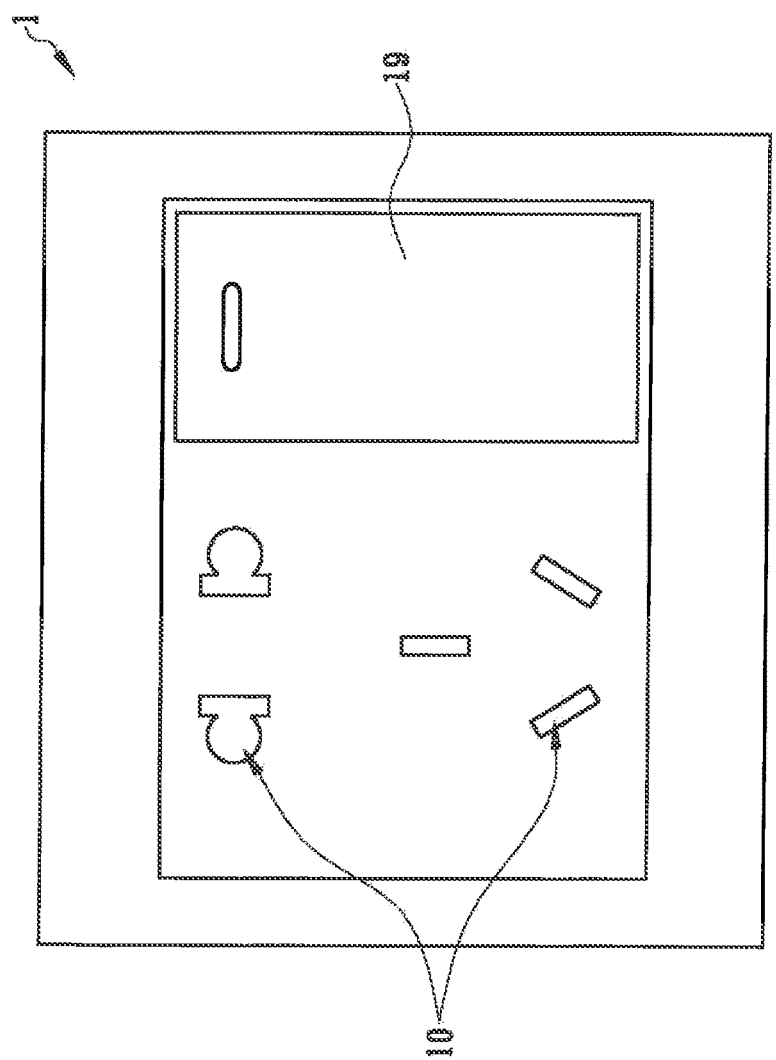
FIG. 2 is a schematic drawing of a product based on the embodiment shown in FIG. 1.

As shown in FIG. 1 and FIG. 2, the switching device 1 includes a power switching portion 11, a control unit 13, a wireless module 15, an auxiliary power unit 17, and an input unit 19 (e.g., a (mechanical) press-key, a touch panel, a combination of press-keys (i.e., a plurality of press-keys), or a touch key (e.g., a capacitive touch key or one activated by blockage of light)). The power switching portion 11 is configured to receive external electricity L (e.g., mains electricity). In this embodiment, the switching device 1 may be an independent product to be inserted directly into an indoor wall socket in order to receive the external electricity L through the socket. The power switching portion 11 transmits the external electricity L to the output end 10 when in a power supplying mode (i.e., when forming a closed circuit) and stops transmitting the external electricity L to the output end 10 when in a power-off mode (i.e., when forming an open circuit).

With continued reference to FIG. 1 and FIG. 2, the control unit 13 is separately electrically connected to the power switching portion 11, the wireless module 15, and the input unit 19. In this embodiment, pressing the input unit 19 while the power switching portion 11 is in the power-off mode will cause the control unit 13 to switch the power switching portion 11 to the power supplying mode, thereby allowing the output end 10 to output electricity (e.g., alternating current) to the lamp driving device 21, in order for the lamp driving device 21 to turn on the LED lamp 23. When the input 19 is pressed again, the control unit 13 will switch the power switching portion 11 back to the power-off mode so that the output end 10 stops outputting electricity to the lamp driving device 21, which in consequence turns off the LED lamp 23. It can be known from the above that a user can turn on and off the lamp with ease simply by operating the input unit 19.

With continued reference to FIG. 1 and FIG. 2, the wireless module 15 in this embodiment is configured to receive a wireless control signal from the wireless controller 22 and transmit the wireless control signal to the control unit 13, in order for the control unit 13 to adjust the power switching portion 11 to the power supplying mode or the power-off mode according to the content of the wireless control signal and thereby change the light-emitting state of the LED lamp 23. For example, once the wireless controller 22 is operated (e.g., after a user presses the ON or OFF button on the wireless controller 22), the wireless controller 22 generates a corresponding wireless control signal (which includes an instruction to turn on or off the lamp) and transmits the wireless control signal to the wireless module 15. The wireless module 15, in turn, transmits the wireless control signal to the control unit 13 to control the power switching portion 11 and thereby adjust the light-emitting state of the LED lamp 23.

With continued reference to FIG. 1 and FIG. 2, the auxiliary power unit 17 additionally provided in the switching device 1 is electrically connected to the control unit 13, the wireless module 15, and the input unit 19 and is configured to receive the external electricity L in order to supply to the control unit 13, the wireless module 15, and the input unit 19 the electricity required for their operation. The auxiliary power unit 17 is so designed that, even after a user turns off the lamp, and thus brings the power switching portion 11 to the power-off mode, by operating the input unit 19, the auxiliary power unit 17 continues supplying electricity to the control unit 13 and the wireless module 15 so that the control unit 13 and the wireless module 15 remain operative. This allows the wireless controller 22 to be subsequently used to send a wireless control signal to the wireless module 15, and the wireless module 15 will, upon receiving the wireless control signal from the wireless controller 22, transmit the wireless control signal to the control unit 13 in order to bring the power switching portion 11 back to the power supplying mode, thereby allowing the lamp driving device 21 and the LED lamp 23 to receive electricity to start the operation of the lamp.

Figure 3:
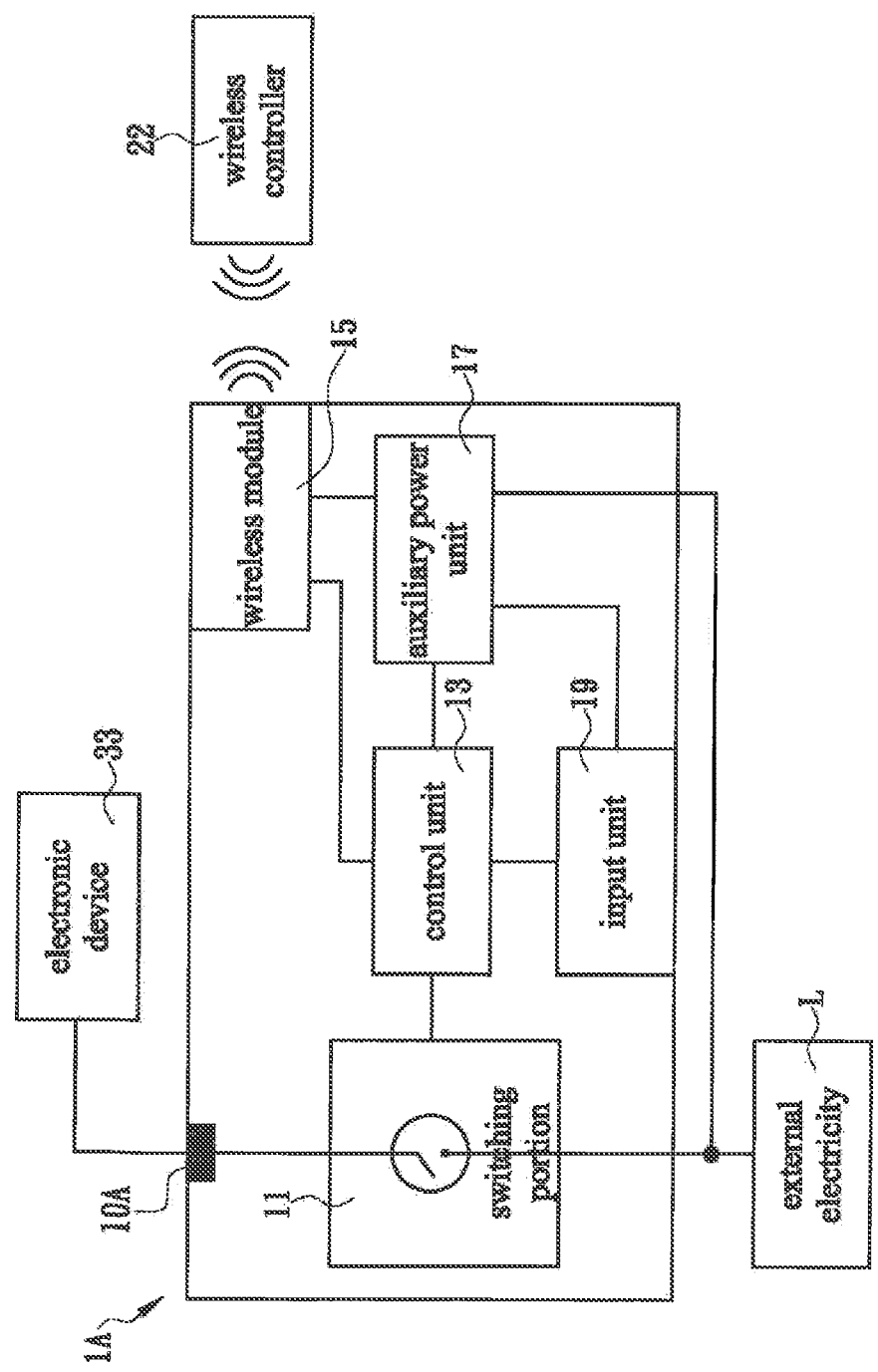
FIG. 3 is a block diagram showing the hardware of another embodiment of the invention.
Figure 4:
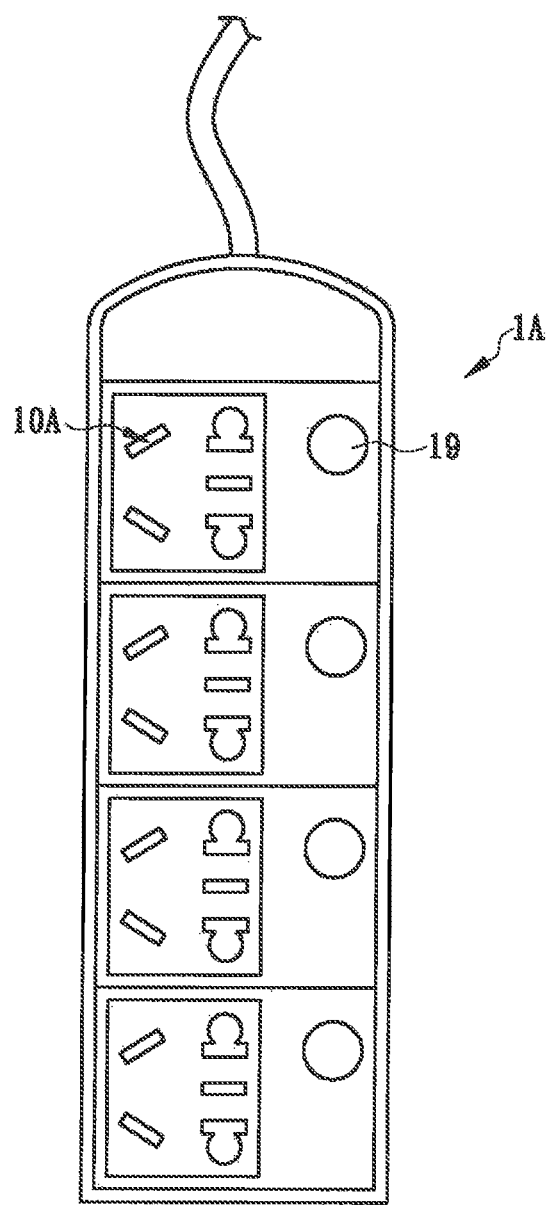
FIG. 4 is a schematic drawing of a product based on the embodiment shown in FIG. 3.

It should be pointed out that, while the switching device 1 in this embodiment is a wall-mounted panel-shaped switch product (as shown in FIG. 2), with the output end 10 configured as a socket to be inserted by, and thus electrically connected to, the plug of a lamp, a person skilled in the art may modify the switching device 1 according to product requirements. For example, the switching device 1A shown in FIG. 3 and FIG. 4 is designed as an extension cord (or power strip, see FIG. 4) and has an output end 10A configured for electrical connection with the plug of an electronic device 33 (e.g., an electronic curtain). The remaining components of the switching device 1A (e,g., the power switching portion 11, the control unit 13, the wireless module 15, the auxiliary power unit 17, and the input unit 19) are identical to their counterparts in the switching device 1 in terms of connection and interaction and are therefore indicated respectively by the same reference numerals without further description. A user only has to connect the electronic device 33 electrically to the output end 10A of the switching device 1A, and the electronic device 33 will be wirelessly and remotely controllable even if the electronic device 33 is not configured for wireless remote control in the first place. That is to say, a user will be able to turn on (i.e., to start power supply to) and off (i.e., to stop power supply to) the electronic device 33 by changing the state of the power switching portion 11 remotely through the wireless controller 22.

Referring back to FIG. 1, it can be known from the above that the control unit 13, the wireless module 15, and the input unit 19 have an independent power source (i.e., are powered by the auxiliary power unit 17), so the wireless controller 22 remains operative after the lamp is turned off. Obviously, the present invention provides greater convenience than the conventional lamp switching devices, whose internal components are out of power, and thus render the associated wireless controller inoperative, when the lamp switching devices are in the power-off mode (or the mode for turning off the associated lamp). Furthermore, the power switching portion 11 may be implemented as a relay or thyristor, and the control unit 13 may be designed accordingly so as to supply, or stop supplying, current to the relay or thyristor according to the content of the input signal, thereby changing the positions of the connected pins of the relay or thyristor to bring about the power supplying mode or power-off mode. In other embodiments of the present invention, a person skilled in the art may also adjust the circuitry of the power switching portion 11 to satisfy product requirements.

The lamp system formed jointly by the switching device 1, the lamp driving device 21, and the LED lamp 23 not only provides the basic function with which to turn on and off the lamp, but also allows the brightness of the LED lamp 23 to be adjusted as needed. In the embodiment shown in FIG. 1, the input unit 19 is configured as a press-key so that a user can adjust the brightness of the lamp by pressing the press-key, as explained below. While the power switching portion 11 is in the power-off mode, a user may press the input unit 19 in order for the control unit 13 to receive a first input signal from the input unit 19 and adjust the power switching portion 11 to the power supplying mode. After that, and within a first period (e.g., 1.2 seconds) starting from the aforesaid pressing operation, the user may press the input unit 19 again in order for the control unit 13 to receive a second input signal from the input unit 19. Upon determining that the interval between the two consecutive input signals is not longer than the first period, the control unit 13 generates a control signal that includes a brightness adjustment instruction, and this control signal is transmitted by the control unit 13 to the lamp driving device 21, which then reduces (or increases) the brightness of the LED lamp 23 continuously until the input unit 19 is pressed for a third time. When the input unit 19 is pressed for the third time, the control unit 13 receives a third input signal from the input unit 19, generates a control signal including a brightness adjustment termination instruction, and transmits this control signal to the lamp driving device 21 in order to keep the brightness of the LED lamp at the current adjusted level. By the same token, a user may press the press-key on the wireless controller 22 in such a way that the control unit 13 receives a first wireless control signal, a second wireless control signal, and a third wireless control signal sequentially, and the control unit 13 will in that case determine whether or not the interval between the first wireless control signal and the second wireless control signal is longer than the first period. If the interval is not longer than the first period, the control unit 13 will generate a control signal including a brightness adjustment instruction and, when subsequently receiving the third wireless control signal, generate a control signal including a brightness adjustment termination instruction. Thus, the user can adjust the brightness of the LED lamp 23 through the wireless controller 22 just as well.

In this embodiment, it is the control unit 13 of the lamp system that determines the interval between two input signals (or wireless control signals) and thereby determines whether or not to adjust the brightness of the LED lamp 23. In other embodiments of the present invention, referring back to FIG. 1, the lamp system may use the lamp driving device 21 instead to determine whether or not to adjust the brightness of the LED lamp 23. For example, while the power switching portion 11 is in the power supplying mode, a user may press the input unit 19 so that the control unit 13 adjusts the power switching portion 11 to the power-off mode (to turn off the LED lamp 23). After that, and within a first period (e.g., 1.2 seconds) starting from the aforesaid pressing operation, the user may press the input unit 19 again so that the control unit 13 adjusts the power switching portion 11 back to the power supplying mode. If the input unit 19 is so pressed, the lamp driving device 21 will determine that the interval between the termination of power reception (i.e., the instant at which the power switching portion 11 enters the power-off mode) and the restoration of power reception (i.e., the instant at which the power switching portion 11 reenters the power supplying mode) is not longer than the first period, and start to reduce (or increase) the brightness of the LED lamp 23 continuously. When the brightness of the LED lamp 23 reaches the desired level, the user presses the input unit 19 for a third time so that the control unit 13 adjusts the power switching portion 11 to the power-off mode (to turn off the LED lamp 23). Then, the user only has to press the input unit 19 for a fourth time within a second period (e.g., 1.2 seconds) starting from the third press, and the control unit 13 will adjust the power switching portion 11 back to the power supplying mode, with the lamp driving device 21 maintaining the brightness of the LED lamp 23 at the last adjusted level (i.e., the brightness level immediately before the power switching portion 11 enters the power-off mode in response to the third press).

The embodiments described above serve to expound the objectives, technical solutions, and beneficial effects of the present invention. It should be understood, however, that those embodiments are not intended to be restrictive of the scope of the invention. All modifications, equivalent substitutions, and improvements based on the principle of the invention should fall within the scope of the invention.

What is claimed is:

1. An integrated switching device with an auxiliary power unit and a wireless receiver function, wherein the integrated switching device has an output end electrically connected to an electricity transmission element, the integrated switching device comprising:
   a power switching portion for receiving external electricity, for forming a closed circuit and thus entering a power supplying mode in which the power switching portion transmits the external electricity to the output end, and for forming an open circuit and thus entering a power-off mode in which the power switching portion stops transmitting the external electricity to the output end;
   an input unit included in the integrated switching device for enabling a user to switch the power switching portion from a power-on mode to a power-off mode and from the power-off mode to the power-on mode;
   a control unit electrically connected to the power switching portion and the input unit, wherein the control unit is configured for receiving an input signal from the input unit and adjusting the power switching portion to the power supplying mode or the power-off mode according to the input signal;
   a wireless module electrically connected to the control unit, wherein the wireless module is configured for receiving a wireless control signal from a wireless controller separate from the integrated switching device and transmitting the wireless control signal to the control unit in order for the control unit to adjust the power switching portion to the power supplying mode or the power-off mode according to content of the wireless control signal, and wherein the power switching portion is configured to be alternately controlled through the control unit by a user operating either the input unit included in the integrated switching device or the wireless controller separate from the integrated switching device; and
   the auxiliary power unit, which is electrically connected to the wireless module and the control unit, electrically connected directly to the input unit, and configured for receiving the external electricity and supplying electricity resulting from the external electricity received to, and thereby enabling operation of, the wireless module, the control unit, and the input unit;
   the integrated switching device being characterized in that, while the power switching portion is in the power-off mode, the auxiliary power unit continues supplying electricity resulting from the external electricity received to the wireless module, the control unit, and the input unit to enable the wireless module to transmit the wireless control signal received to the control unit, in order for the control unit to adjust the power switching portion to the power supplying mode even when the power switching portion has been switched to a power-off mode by a user operating the input device.

2. The integrated switching device of claim 1, wherein the output end is configured as a socket.

3. The integrated switching device of claim 2, wherein the power switching portion is a relay or a thyristor.

4. A lamp system with an auxiliary power unit and a wireless receiver function, comprising:
   a light-emitting diode (LED) lamp;
   a lamp driving device electrically connected to the LED lamp and configured for adjusting a light-emitting state of the LED lamp;
   an integrated switching device having an output end electrically connected to the lamp driving device, wherein the integrated switching device is wirelessly connected to a wireless controller and comprises:
   a power switching portion for receiving external electricity, for forming a closed circuit and thus entering a power supplying mode in which the power switching portion transmits the external electricity to the output end in order for the lamp driving device and the LED lamp to receive electricity and for the LED lamp to be turned on, and for forming an open circuit and thus entering a power-off mode in which the power switching portion stops transmitting the external electricity to the output end such that the lamp driving device and the LED lamp no longer receive electricity and the LED lamp is turned off;
   an input unit included in the integrated switching device for enabling a user to switch the power switching portion from a power-on mode to a power-off mode and from the power-off mode to the power-on mode;
   a control unit electrically connected to the power switching portion and the input unit, wherein the control unit is configured for receiving an input signal from the input unit and adjusting the power switching portion to the power supplying mode or the power-off mode according to the input signal;
   a wireless module electrically connected to the control unit, wherein the wireless module is configured for receiving a wireless control signal from the wireless controller and transmitting the wireless control signal to the control unit in order for the control unit to adjust the power switching portion to the power supplying mode or the power-off mode according to content of the wireless control signal, and wherein the power switching portion is configured to be alternately controlled through the control unit by a user operating either the input unit included in the integrated switching device or the wireless controller separate from the integrated switching device; and
   the auxiliary power unit, which is electrically connected to the wireless module and the control unit, electrically connected directly to the input unit, and configured for receiving the external electricity and supplying electricity resulting from the external electricity received to, and thereby enabling operation of, the wireless module, the control unit, and the input unit;
   the lamp system being characterized in that, while the power switching portion is in the power-off mode, the auxiliary power unit continues supplying electricity resulting from the external electricity received to the wireless module, the control unit, and the input unit to enable the wireless module to transmit the wireless control signal received to the control unit, in order for the control unit to adjust the power switching portion to the power supplying mode and then turn on or off the LED lamp even when the power switching portion has been switched to a power-off mode by a user operating the input device.

5. The lamp system of claim 4, wherein the input unit is configured as a press-key; while the power switching portion is in the power-off mode, the control unit adjusts the power switching portion to the power supplying mode upon receiving a first input signal from the input unit; the control unit generates a first control signal including a brightness adjustment instruction when subsequently receiving a second input signal from the input unit and determining that an interval between the second input signal and the first input signal is shorter than a first period; and the control unit transmits the first control signal to the lamp driving device in order for the lamp driving device to reduce or increase brightness of the LED lamp continuously.

6. The lamp system of claim 5, wherein the control unit generates a second control signal including a brightness adjustment termination instruction when subsequently receiving a third input signal from the input unit, and transmits the second control signal to the lamp driving device in order for the lamp driving device to keep the brightness of the LED lamp at a current adjusted level.

7. The lamp system of claim 4, wherein the input unit is configured as a press-key; while the power switching portion is in the power supplying mode, the control unit adjusts the power switching portion to the power-off mode upon receiving a first input signal from the input unit; the control unit adjusts the power switching portion to the power supplying mode when subsequently receiving a second input signal from the input unit; and the lamp driving device reduces or increases brightness of the LED lamp continuously upon determining that an interval between a latest termination of power reception and a latest restoration of power reception is not longer than a first period.

8. The lamp system of claim 7, wherein while the lamp driving device continues reducing or increasing the brightness of the LED lamp, the control unit adjusts the power switching portion to the power-off mode upon receiving a third input signal from the input unit; the control unit adjusts the power switching portion to the power supplying mode when subsequently receiving a fourth input signal from the input unit; and the lamp driving device keeps the brightness of the LED lamp at a level corresponding to an instant immediately before the power switching portion is adjusted to the power-off mode in response to the third input signal, upon determining that an interval between a latest termination of power reception and a latest restoration of power reception is not longer than a second period.

9. The lamp system of claim 6, wherein the output end is configured as a socket.

10. The lamp system of claim 8, wherein the output end is configured as a socket.

11. The lamp system of claim 9, wherein the power switching portion is a relay or a thyristor.

12. The lamp system of claim 10, wherein the power switching portion is a relay or a thyristor.

* * * * *